United States Patent [19]

Lee et al.

[11] Patent Number: 5,652,548
[45] Date of Patent: Jul. 29, 1997

[54] PTM SIGNAL GENERATOR COMBINING OUTPUTS OF TWO SAME FREQUENCY OSCILLATORS

[75] Inventors: Charles A. Lee; G. Conrad Dalman, both of Ithaca, N.Y.

[73] Assignee: Cornell Research Foundation, Inc., Ithaca, N.Y.

[21] Appl. No.: 487,530

[22] Filed: Jun. 7, 1995

[51] Int. Cl.[6] ............................ H03B 28/00; G02F 1/01
[52] U.S. Cl. ........................... 331/55; 331/56; 331/96; 331/173; 332/106; 359/238; 375/238; 375/239
[58] Field of Search ............................ 331/2, 46, 55, 331/56, 96, 106, 173; 332/106, 109, 110, 112, 113; 359/237, 238; 375/238, 239

[56] References Cited

U.S. PATENT DOCUMENTS

| | | | |
|---|---|---|---|
| 2,803,750 | 8/1957 | Dayem | 331/55 |
| 3,354,408 | 11/1967 | Crowell | 331/107 R |
| 3,475,699 | 10/1969 | Fjallbrant | 332/163 |
| 3,614,659 | 10/1971 | Rigrod | 372/97 |
| 4,048,583 | 9/1977 | Nigrin | 331/56 |
| 4,366,454 | 12/1982 | Salzberg | 333/164 |
| 4,467,284 | 8/1984 | Farkas | 375/52 |
| 4,763,085 | 8/1988 | Lamberg | 331/56 |
| 5,105,168 | 4/1992 | Da Silva | 331/2 |
| 5,172,382 | 12/1992 | Loh et al. | 372/26 |
| 5,212,463 | 5/1993 | Babbitt et al. | 333/161 |

OTHER PUBLICATIONS

Chang, Kai et al., "Millimeter-Wave Power-Combining Techniques", IEEE Transactions on Microwave Theory and Techniques, vol. MTT-31, No. 2, Feb. 1983, pp. 91–107.

Nogi, Shigeji et al., "Mode Analysis and Stabilizaton of a Spatial Power Combining Array with Stronly Coupled Oscillators", IEEE Transactions on Microwave Theory and Techniques, vol. 41, No. 10, Oct. 1993, pp. 1827–1837.

York, Robert A. et al., "Quasi-Optical Power Combining Using Mutually Synchronized Oscillator Arrays", IEEE Transactions on Microwave Theory and Techniques, vol. 39, No. 6, Jun. 1991, pp. 1000–1009.

York, Robert A, "Nonlinear Analysis of Phase Relationships in Quasi-Optical Oscillator Arrays", IEEE Transactions on Microwave Theory and Techniques, vol. 41, No. 10, Oct. 1993, pp. 1799–1809.

Primary Examiner—Siegfried H. Grimm
Attorney, Agent, or Firm—Jones, Tullar & Cooper, P.C.

[57] ABSTRACT

A high frequency pulse-time modulation signal generator employs first and second microwave or laser oscillators which are mutually locked uniquely either in a symmetric mode or an antisymmetric mode by means of an electronic phase shifter. The output signals from the oscillators are combined to generate pulse-time modulated output pulses through application of a control voltage to the electronic phase shifter which switches the mutual locking of the oscillators back and forth between the symmetric and antisymmetric modes. In a microwave embodiment, a hybrid-tee, such as a magic-tee, is employed to combine the oscillator output signals, while in the optical or laser embodiment, a half-silvered mirror is employed to combine the oscillator output signals. When the oscillators are locked in the symmetric mode, the hybrid-tee generates an output pulse, and when the oscillators are locked in the antisymmetric mode, the hybrid-tee generates a zero level output. The signal generator is particularly adapted for use in microwave communication systems having an operating frequency from between 50 and 200 GHz, as well as in laser based optical communication systems.

16 Claims, 3 Drawing Sheets

PTM SIGNAL GENERATOR COMBINING OUTPUTS OF TWO SAME FREQUENCY OSCILLATORS

BACKGROUND OF THE INVENTION

The present invention relates in general to a pulse-time modulation (PTH) signal generator for generating signals at microwave, mm-wave and optical wavelengths.

As microwave and laser based communication systems employ signals of progressively higher and higher frequencies (e.g., in excess of 10 GHz), it becomes increasingly difficult to design oscillator circuits which can be switched on and off accurately as required in pulse-time modulation (PTM) communication schemes, such as pulse-width modulation (PWM) and pulse-position modulation (PPM). In PTM systems, the information transmitted on the signal is contained in the relative positions of modulated pulses as the signal is switched on and off, and the switching is typically achieved by switching the signal generating oscillator on and off. Such arrangements work fairly well at low frequencies, but are not readily implemented at very high frequencies due to adverse ambient effects and inherent limitations on oscillator switching speeds.

SUMMARY OF THE INVENTION

The present invention seeks to provide a high frequency PTM signal generator which avoids speed limitations of previous switching devices and yet provides a very efficient and simple design. This is achieved through provision of a signal generator that employs a pair of mutually locked, substantially identical oscillators and an incremental electronic phase shifter that is employed to lock the oscillators in one of two modes. In the first, symmetric mode, the oscillators are locked in phase with one another so that their signals can be combined to form an output pulse. In the second, antisymmetric mode, the oscillators are locked out of phase with one another so that their signals, when combined, will cancel each other out, thus resulting in a zero level output.

The outputs of the two oscillators are combined in any suitable manner, such as by a hybrid-tee in a microwave embodiment, or by a half-silvered mirror in a laser embodiment. In the symmetric mode, the oscillator powers add at the output of the hybrid-tee or mirror, while in the antisymmetric mode, the powers cancel at the output. In this manner, the output signal can be pulse modulated by controlling operation of the phase shifter to cause alternate locking of the oscillators between the symmetric and antisymmetric modes.

BRIEF DESCRIPTION OF THE DRAWINGS

The features and advantages of the present invention will become apparent from the following detailed description of a number of preferred embodiments thereof, taken in conjunction with the accompanying drawings, in which.

DETAILED DESCRIPTION OF THE PREFERRED EMBODIMENTS

Figure 1A:
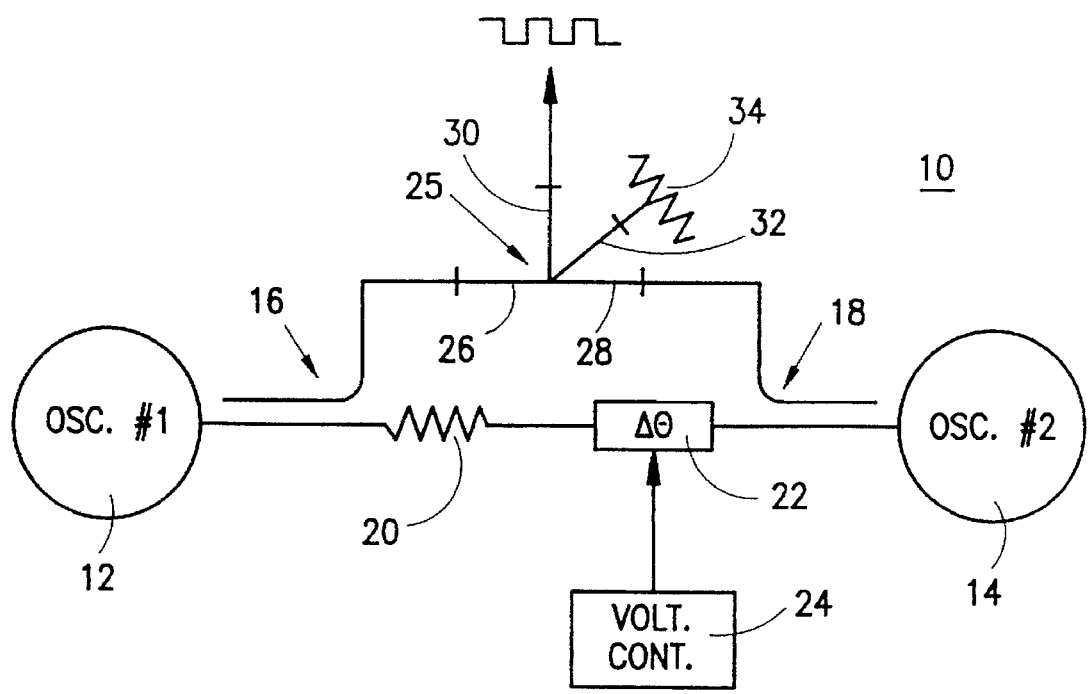
FIGS. 1A and 1B are schematically illustrated drawings of two variations of a microwave signal generator circuit constructed in accordance with a first preferred embodiment of the present invention.
Figure 1B:
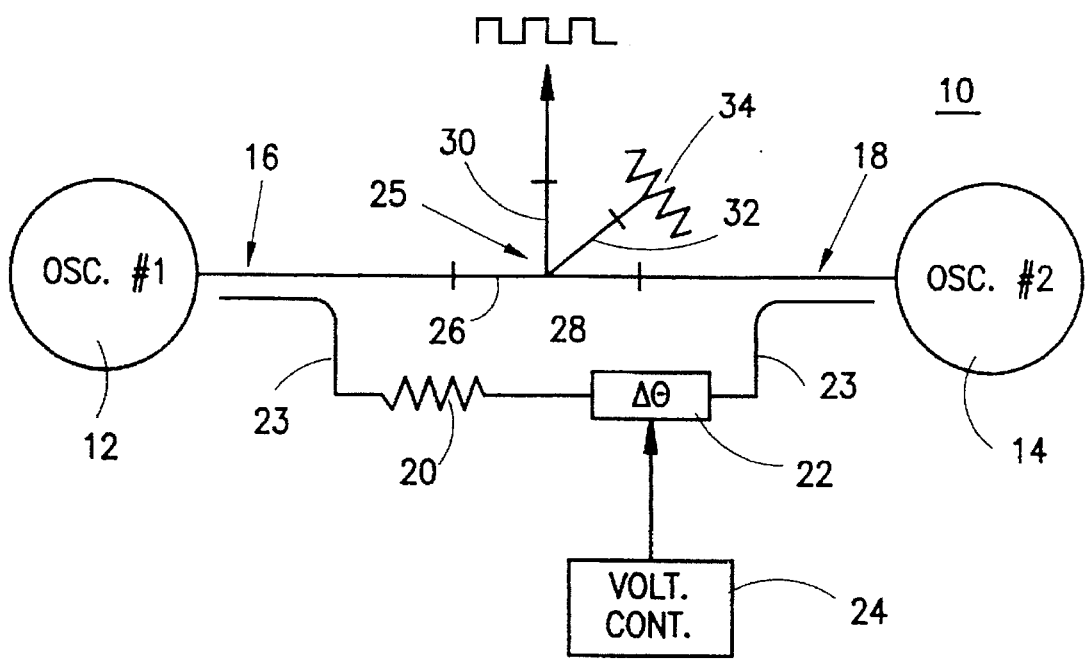

Turning now to a more detailed consideration of a first preferred embodiment of the present invention, FIGS. 1A and 1B illustrate first and second variations of microwave signal generator circuit 10 comprising first and second oscillators 12 and 14 which are continuously operated and are substantially identical to one another in operating frequency and output power. Preferably, each of the oscillators 12 and 14 operates in the frequency bands from 10 to 200 GHz and higher.

Connected between the outputs of each of the oscillators 12 and 14 through first and second directional couplers 16 and 18, respectively, are an attenuator 20 and an incremental phase shifter 22. The phase shifter 22 is preferably electronic or ferro-electric, and for example can be of the type disclosed in U.S. Pat. No. 5,212,463 to Babbitt et al. The phase shifter disclosed in Babbitt et al. employs a high dielectric-constant ferro-electric material, such as $Ba_xSr_{1-x}TiO_3$, for the phase shifting element. The dielectric constant if the material is varied through application of a DC voltage thereto, and this variation causes a phase shift.

The attenuator 20 is formed preferably of lossy material, and can actually be an integral part of the phase shifter 22 when the phase shifting material is also lossy as in the phase shifter disclosed in the Babbitt et al. patent. This loss is a necessary factor in obtaining the desired modal properties described in this invention. Alternatively, the circuit variation illustrated in FIG. 1B can be employed to provide most of the loss needed to obtain the desired locking behavior. As is conventional, each of the directional couplers 16 and 18 has a third arm 23 which introduces a 3 dB loss in a signal passing therethrough. Thus, in the variation illustrated in FIG. 1B, the attenuator 20 and phase shifter 22 are connected to the lossy third arms 23 of the directional couplers 16 and 18, respectively. As a result, the loss provided by the attenuator 20 can be reduced to a negligible value.

By controlling the voltage applied to the phase shifter 22, the effective path length between the first and second oscillators 12 and 14 can be varied to be any desired multiple of $\pi$ radians long. When the path length is an even number of $\pi$ radians, the oscillators 12 and 14 will be mutually locked uniquely in their symmetric mode, and when the path length is an odd number of $\pi$ radians, the oscillators 12 and 14 will be mutually locked uniquely in their antisymmetric mode. A voltage controller circuit 24 is connected to the phase shifter 22 to provide this path length variation. The voltage controller 24 is preferably implemented using conventional high speed switching circuitry.

The outputs of the oscillators 12 and 14 are also coupled to a hybrid-tee 25, which can be a magic-tee or a 180° hybrid, for example. The hybrid-tee 25 includes a first H-arm 26 that is connected through the directional coupler 16 to the output from the first oscillator 12, and a second H-arm 28 that is connected through the directional coupler 18 to the output of the oscillator 14. A pulsed output is generated on a third H-arm 30 of the hybrid-tee 25 which is the sum of the outputs of the oscillators 12 and 14 when they are mutually locked in the symmetric mode, and is a zero level output when the oscillators 12 and 14 are mutually locked in the antisymmetric mode. An E-arm 32 of the hybrid-tee 25 supplies the inverse of the pulsed output to a load 34 which absorbs the combined power from the oscillators 12 and 14 when they are mutually locked in the antisymmetric mode.

In operation, the signal generator 10 provides a pulsed output on the third H-arm 30 which can be modulated in accordance with any pulse-time modulation scheme, such as pulse-width modulation (PWM) or pulse-position modulation (PPM) by modulating the control voltage for the phase shifter 22 so that the oscillators 12 and 14 are switched between their symmetric and antisymmetric modes at the appropriate times to generate the desired pulsed output. In this manner, switching of the oscillators 12 and 14 on and off is not required, and the desired switching action is carried out solely by controlling the operation of the phase shifter 22 which can be easily implemented through use of the conventional high speed switching circuitry in the voltage controller 24. As a result, no special considerations need be given to the operational parameters of the oscillators 12 and 14 as long as they are substantially identical to one another. Further, ambient effects on these parameters will not affect the operation of the signal generator 10 since the mutual coupling of the oscillators 12 and 14 will cancel out these effects. Using high speed control circuitry for the phase shifter 22, it is expected that the signal generator 10 can operate efficiently at very high microwave carrier frequencies in the range of between 50 and 200 GHz, as well as at optical frequencies, for example.

Figure 2:
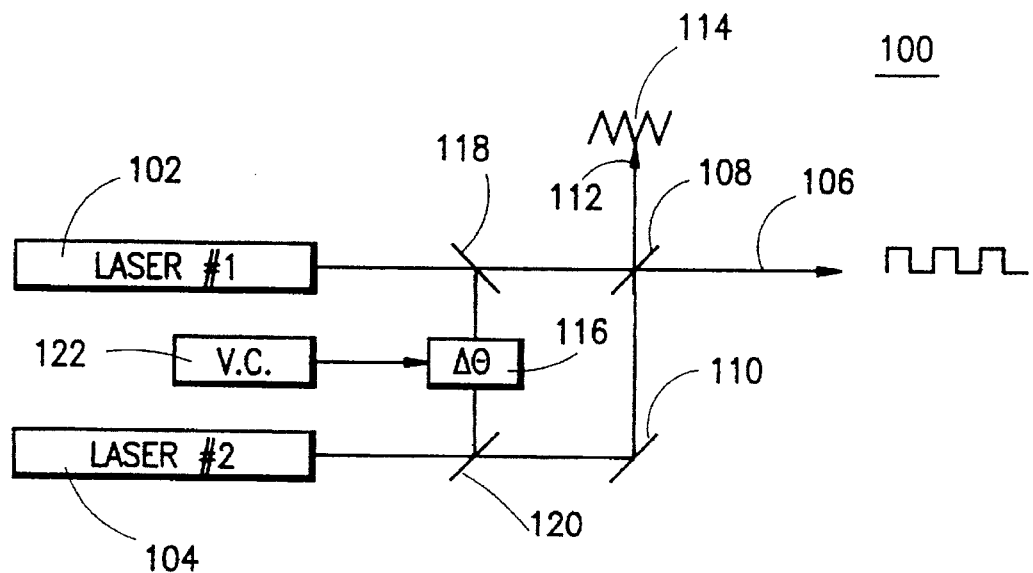
FIG. 2 schematically illustrates a second preferred embodiment of the present invention which is employed for coupling the outputs of two lasers.

FIG. 2 illustrates a second preferred embodiment of the present invention which employs optical devices instead of microwave devices, and is the optical analog of the second variation of the first preferred embodiment illustrated in FIG. 1B. More particularly, FIG. 2 illustrates an optical PTM circuit 100 in which the outputs of first and second identical lasers 102 and 104, which act as optical oscillators, are combined to form an output 106. A pair of mirrors 108 and 110 are employed to align the outputs of the first and second lasers 102 and 104. The mirror 110 is a totally reflecting mirror which reflects the output from the second laser 104 by 90°, while the mirror 108 is a half-silvered mirror which both transmits the beam from the first laser 102, and reflects the beam from the second laser 104 back another 90°, thereby aligning the two laser outputs. If the two laser beams are in-phase, their signals are added to form the output signal 106. If the beams are out-of-phase with one another, their outputs cancel, thus resulting in the output signal 106 having a zero level. As in the microwave embodiments, a second output 112, which is the inverse of the first output signal 106, is emitted from the half-silvered mirror 108 into a load 114.

An optical phase shifter 116 receives approximately 10% of the output signals from the first and second lasers 102 and 104 through first and second partially silvered mirrors, 118 and 120, respectively. The partially silvered mirrors 118 and 120 therefore serve the same purpose as the directional couplers 16 and 18 and the attenuator 20 in the microwave embodiment of FIG. 1B. As in the microwave embodiments of FIGS. 1A and 1B, the phase shifter 116 is employed to change the path length between the two lasers 102 and 104, thereby changing the phase of their output signals with respect to one another. Also, a voltage controller 122 similar to the voltage controller 24 of FIGS. 1A and 1B is employed to control the phase shifter 116 for this purpose.

To provide a theoretical basis for the present invention, a mode analysis of two coupled oscillators will now be presented. To examine the modal stability of two identical coupled oscillators, the following standard textbook circuit model can be employed:

$$\frac{dV_1}{dt} = -\left[\frac{\Delta\omega C}{C_{eq}} \sin\gamma + \Omega_D(\cos\beta)\Delta D_1\right] V_1 + \frac{1}{C_{eq}} Re[\exp(-j\omega_o t - j\gamma - j\phi)]i_1(t), \quad (1)$$

$$\frac{d\phi}{dt} = -\frac{\Delta\omega C}{C_{eq}} \cos\gamma - \Omega_D(\sin\beta)\Delta D_1 + \frac{1}{V_1 C_{eq}} Im[\exp(-j\omega_o t - j\gamma - j\phi)]i_1(t), \quad (2)$$

where $\omega_o$ is the angular frequency of operation; $\Delta\omega = \omega_o - \omega_c$, the change from the free running value; $V_1$ and $\phi$ are the voltage amplitude and phase of the oscillator; $\Delta D_1 = V_1 - V_c$ where $V_c$ is the free running amplitude; $C'$ is the equivalent capacitance of the circuit; $\Omega D$ is proportional to the amplitude dependence of the frequency; $C_{eq}$ is $C'$ plus the electronic capacitance-component of the active element and $\gamma$ is a phase angle which will be nonzero if the negative conductance varies with frequency. The parameter $\beta$ includes the effects of an amplitude dependent electronic susceptance and the phase due to frequency dependence of the negative conductance (i.e., that of $\gamma$). The last term, $i_1(t)$, represents the real part of the injected current from some external source, which in the present case will be due to that of the second identical oscillator 14 coupled to the first oscillator 12.

To determine the current injected into the first oscillator 12 by the second one 14, consider the ABCD matrix of the coupling network relating the voltage and current at the first oscillator 12 to those of the second:

$$\begin{pmatrix} a_1 \\ I_1 \end{pmatrix} = \begin{pmatrix} A & B \\ C & D \end{pmatrix} \begin{pmatrix} a_2 \\ -I_2 \end{pmatrix}, \quad (3)$$

where $a_1$ and $a_2$ are the voltage phasors of the two oscillators. Eliminating $I_2$ from these equations gives the injected current in the first oscillator 12:

$$I_1 = \frac{Da_1}{B} - \frac{a_2}{B}. \quad (4)$$

Figure 3:
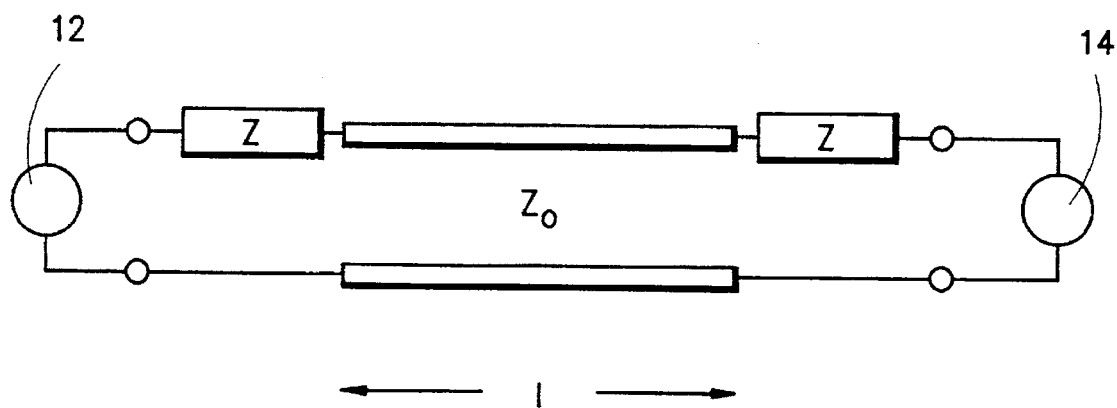
FIG. 3 schematically illustrates a general coupling circuit for coupling two identical oscillators.

The first term, which is proportional to $a_1$, represents a load on the first oscillator 12 while the second term represents the current injected by second oscillator 14 into first oscillator 12. A reasonably general coupling circuit consists of a lumped impedance, Z, from the first oscillator 12 followed by a section of transmission line followed by another lumped impedance, Z, to the second oscillator as shown in FIG. 3.

Solving for the matrix elements of Equation (3):

$A = D = \cosh\Gamma l + ZY_o \sinh\Gamma l$, $B = 2Z\cosh\Gamma l + (Z_o + Z^2 Y_o)\sinh\Gamma l$, $C = Y_o \sinh\Gamma l$, where $\Gamma = \alpha + j\beta_c$ is the complex propagation constant of the line. Inserting these relations into Equation (4) and rearranging terms $$\frac{D}{B} = \frac{(1+z) + (1-z)e^{-2\Gamma l}}{(1+z)^2 - (1-z)^2 e^{-2\Gamma l}} \cdot 2Y_o, \quad (5)$$

using $z = Z/Z_o$ and $$\frac{1}{B} = \frac{2Y_o e^{-\Gamma l}}{(1+z)^2 - (1-z)^2 e^{-2\Gamma l}}. \quad (6)$$

The coupling schemes illustrated in FIGS. 1A and 1B have $z=0$ and incorporate loss in the transmission line such that the terms in $e^{-2\Gamma l}$ may be neglected. In FIG. 1B, loss is primarily incorporated by the directional couplers 16 and 18 and in FIG. 2, the loss is incorporated by the partially silvered mirrors 118 and 120. For these cases, the current injected in the first oscillator 12 can be written as:

$$i_I = -Re[2Y_o a_2 e^{-\alpha l - j\theta}], \tag{7}$$

where $\eta=\beta_c l$ and the term $2Y_o V_1$ is associated with the oscillator load. Note that at lower frequencies where lumped elements can be fabricated, $Z=1$ gives essentially the same form for the feedback term. With these restrictions on the coupling between the oscillators, the coupled equations of these two oscillators are:

$$\frac{dV_1}{dt} = -\left[\frac{\Delta\omega C}{C_{eq}}\sin\gamma + \Omega_D\cos\beta\Delta D_1\right]V_1 + \tag{8}$$
$$\frac{R}{C_{eq}}\cos(\gamma+\theta+\Delta\phi_1)]V_2(t),$$

$$\frac{dV_2}{dt} = -\left[\frac{\Delta\omega C}{C_{eq}}\sin\gamma + \Omega_D\cos\beta\Delta D_2\right]V_2 + \tag{9}$$
$$\frac{R}{C_{eq}}\cos(\gamma+\theta+\Delta\phi_1)]V_1(t),$$

$$\frac{d\phi_1}{dt} = -\left[\frac{\Delta\omega C}{C_{eq}}\cos\gamma + \Omega_D\sin\beta\Delta D_1\right] - \tag{10}$$
$$\frac{R}{C_{eq}}\sin(\gamma+\theta+\Delta\phi)\frac{V_2}{V_1},$$

$$\frac{d\phi_2}{dt} = -\left[\frac{\Delta\omega C}{C_{eq}}\cos\gamma + \Omega_D\sin\beta\Delta D_2\right] - \tag{11}$$
$$\frac{R}{C_{eq}}\sin(\gamma+\theta+\Delta\phi)\frac{V_1}{V_2},$$

where $a_2=V_2 e^{j+2}e^{j\omega_0 t}$ and $a_1=V_1 e^{j+1}e^{j\omega_0 t}$ have been used for the voltage phasors, $\Delta\phi=\phi_1-\phi_2$ and $R=Y_o e^{-\alpha l}$.

The stationary states correspond to setting the time derivatives to zero for the nonlinear set of Equations (8) to (11). Combining these equations gives a compact result for the values of amplitude and relative phase of the two oscillators $$\tan(\Delta\phi_o) = \tan(\gamma+\beta+\theta)\frac{1-(V_{20}/V_{10})^2}{1+(V_{20}/V_{10})^2}. \tag{12}$$

This last equation indicates that for equal oscillator amplitudes the relative phase of the two oscillators is either zero or $\pi$ radians. There is an exceptional case where if $$\gamma+\beta+\eta=\pi/2, \tag{13}$$

and the amplitudes are equal, the relative phase may be arbitrary.

To identify the stable points from this set of stationary points, the set of Equations (8–11) must be linearized and from the secular equation, those solutions with three negative, real roots must be found. The normalized matrix elements of this stability matrix are found to be $$a_{11} = -Kpp\sin\gamma - K\left(2 - \frac{V_{1c}}{V_{10}}\right)\cos\beta, \tag{14}$$

$$a_{21} = \cos(\gamma+\theta-\Delta\phi_o), \tag{15}$$

$$a_{31} = -K\sin\gamma + \frac{V_{20}}{V_{10}}\sin(\gamma+\theta+\Delta\phi_o) + \frac{V_{10}}{V_{20}}\sin(\gamma+\theta-\Delta\phi_o), \tag{16}$$

-continued $$a_{12} = \cos(\gamma+\theta+\Delta\phi_o), \tag{17}$$

$$a_{22} = +Kpp\sin\gamma - K\left(\frac{2V_{20}}{V_{10}} - \frac{V_{1c}}{V_{10}}\right)\cos\beta, \tag{18}$$

$$a_{32} = -K\sin\gamma - \sin(\gamma+\theta+\Delta\phi_o) - \frac{V_{10}^2}{V_{20}^2}\sin(\gamma+\theta-\Delta\phi_o), \tag{19}$$

$$a_{13} = -\frac{V_{20}}{V_{10}}\sin(\gamma+\theta-\Delta\phi_o), \tag{20}$$

$$a_{23} = \sin(\gamma+\theta-\Delta\phi_o), \tag{21}$$

$$a_{33} = -\frac{V_{20}}{V_{10}}\cos(\gamma+\theta+\Delta\phi_o) - \frac{V_{10}}{V_{20}}\cos(\gamma+\theta-\Delta\phi_o), \tag{22}$$

where $K=\Omega_D C_{eq} V_{10}/R$ and $Kpp=\Delta\omega C'/R$. The secular equation corresponding to these coefficients is a cubic equation which may be solved by a standard procedure.

All of the pertinent questions regarding the operation of the present invention can now be answered. The stable solutions of the secular equation have three negative real roots and unstable solutions have either positive real roots or imaginary ones. First choosing the phase delay, $\eta$, in the coupling line to be zero, or an even number of $\pi$ radians, and restricting attention to an ideal frequency independent negative resistance, it is found that $\Delta\phi_o=0$ corresponds to a stable solution while $\Delta\phi_o=\pi$ corresponds to an unstable one. Then if $\eta=\pi$ we find that $\Delta\phi_o=\pi$ corresponds to a stable solution, but $\Delta\phi_o=0$ corresponds to an unstable solution. Thus if one arranges electronic control of the feedback phase shift, $\eta$, one can uniquely shift from a symmetric mode ($\Delta\phi_o=0$) to an antisymmetric mode ($\Delta\phi_o=\pi$).

The particular value of $\eta=\pi/2$ is interesting in that stable roots for both $\Delta\phi_o=0$ and $\Delta\phi_o=\pi$ are found, thus making this value of $\eta$ unsuitable for modulation or for power combining. This 90° shift in the coupling line is equivalent to using a reactance to couple the oscillators. The unique pairing of $\eta$ and $\Delta\phi_o$ can be recaptured by using resistive coupling when it is accomplished by a lumped element as opposed to a distributed element. Thus in either the distributed or the lumped case, some loss must be introduced into the coupling circuit in order for the phase $\eta$ to uniquely determine the symmetric or antisymmetric state. Intuitively one might expect that very strong coupling would pull the oscillators into synchronism, but the introduction of loss seems to be necessary.

Figure 4:
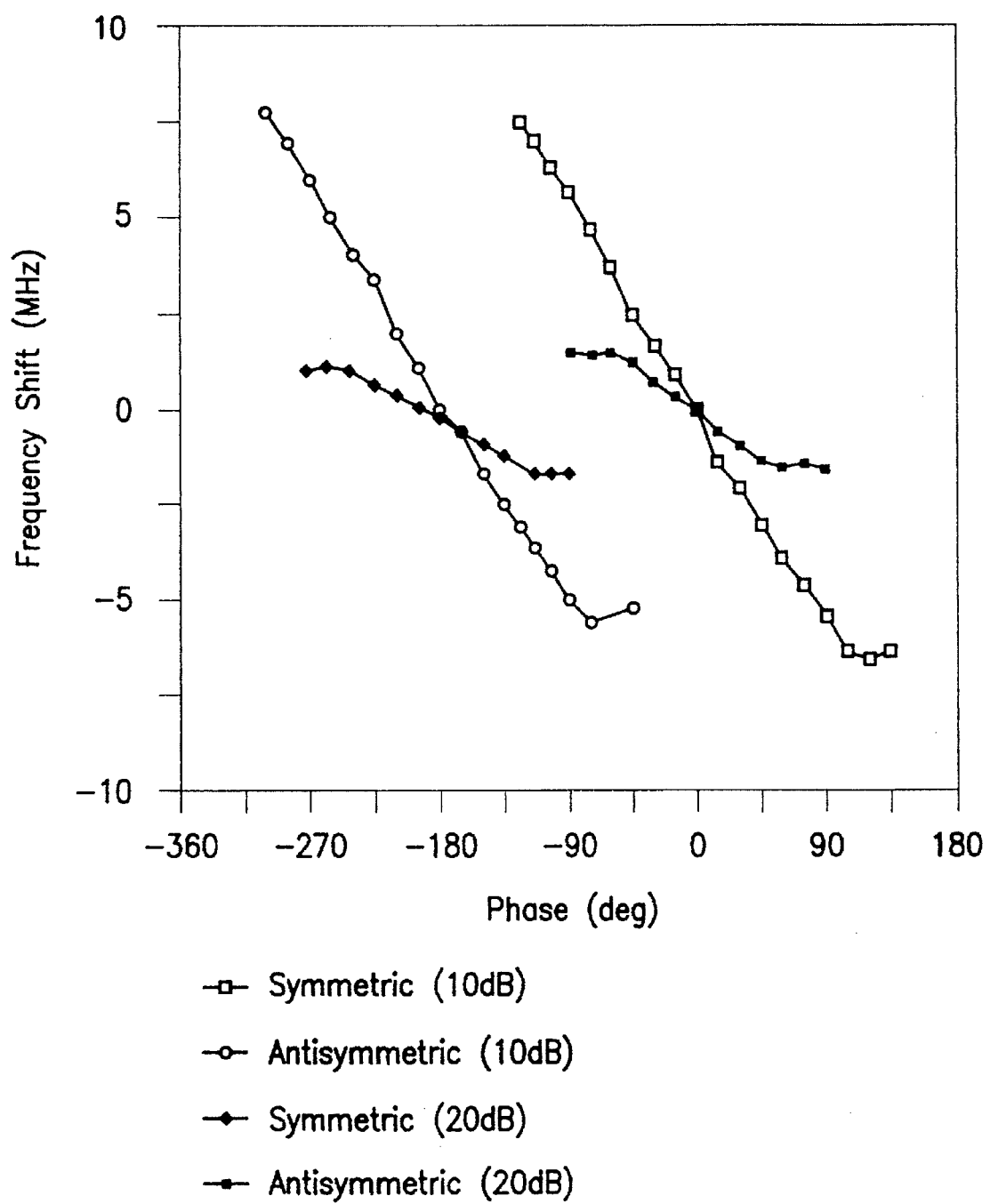
FIG. 4 is a graph illustrating frequency shift versus phase angle for switching between symmetric and antisymmetric modes for two different levels of coupling, 10 dB and 20 dB.

Experimental verification of these properties is shown in FIG. 4 which shows the switching between symmetric and antisymmetric states for two different levels of coupling. For the case of weaker coupling between the oscillators (20 dB), switching occurs very close to $\eta=\pi/2$ while for the case of stronger coupling, there is some hysteresis due to nonlinear reactive effects in the oscillators.

The single valued control of the relative phase of the coupled oscillators shown here is of interest for the combining of larger numbers of oscillators. Extension of the analysis to three and four oscillators with only nearest neighbour lossy coupling and without constraining the amplitudes shows that it is possible to uniquely determine a completely symmetric state or an antisymmetric one (i.e. $\Delta\phi i=\pm\pi$ for all i) by setting $\eta$ equal to zero or $\pi$ radians, provided the appropriate loss is introduced into the coupling system.

Although the invention has been disclosed in terms of a number of preferred embodiments, it will be understood that numerous modifications could be made thereto and variations made thereof without departing from the scope of the invention as set forth in the following claims.

What is claimed is:

1. A high frequency pulse signal generator comprising:

first and second oscillators having operating frequencies substantially identical to one another and each generating an output signal;

means for mutually locking said first and second oscillators uniquely to one another in either a first, symmetric mode, or in a second, antisymmetric mode;

means for controlling said means for mutually locking to switch said first and second oscillators selectively between said symmetric and antisymmetric modes; and, means for combining the outputs from said first and second oscillators and forming a pulsed output signal, said means for combining acting to sum the outputs of said oscillators when they are mutually locked in said symmetric mode and subtract the output of said second oscillator from the output of said first oscillator when they are mutually locked in said antisymmetric mode;

whereby, said pulse output signal can be pulse-time modulated by said means for controlling.

2. The signal generator of claim 1, wherein said means for mutually locking comprises an electronic phase shifter connected between said outputs of said first and second oscillators.

3. The signal generator of claim 2, wherein said means for controlling comprises a voltage controller for supplying a control voltage to said electronic phase shifter.

4. The pulse generator of claim 3, wherein said means for combining comprises a hybrid-tee including a first arm for receiving the output signal from said first oscillator, a second arm for receiving the output signal of said second oscillator and a third arm for generating said pulse output signal.

5. The pulse generator of claim 4, wherein said hybrid-tee is a magic-tee.

6. The pulse generator of claim 4, wherein said hybrid-tee is a 180° hybrid.

7. The pulse generator of claim 1, wherein said means for combining comprises a hybrid-tee including a first arm for receiving the output signal from said first oscillator, a second arm for receiving the output signal of said second oscillator and a third arm for generating said pulse output signal.

8. The pulse generator of claim 7, wherein said hybrid-tee is a magic-tee.

9. The pulse generator of claim 7, wherein said hybrid-tee is a 180° hybrid.

10. The pulse generator of claim 1, wherein said first and second oscillators comprise first and second lasers for generating first and second output laser beams, respectively.

11. The pulse generator of claim 10, wherein said means for mutually locking comprises an electronic phase shifter.

12. The pulse generator of claim 11, wherein said means for controlling comprises a voltage controller for supplying a control voltage to said electronic phase shifter.

13. The pulse generator of claim 12, wherein said means for combining comprises a half silvered mirror positioned to receive the output laser beams from said first and second lasers at a 90° angle relative to each other, and combine them to form said pulse output signal.

14. The pulse generator of claim 11, further comprising first and second partially silvered mirrors positioned in beam paths from said first and second lasers, respectively, for reflecting portions of said first and second output laser beams to said electronic phase shifter.

15. The pulse generator of claim 14, wherein said means for controlling comprises a voltage controller for supplying a control voltage to said electronic phase shifter.

16. The pulse generator of claim 15, wherein said means for combining comprises a half silvered mirror positioned to receive the outputs from said first and second lasers at a 90° angle relative to each other, and combine them to form said pulse output signal.

* * * * *